(12) United States Patent
Park et al.

(10) Patent No.: US 7,687,795 B2
(45) Date of Patent: Mar. 30, 2010

(54) PHASE CHANGE MEMORY DEVICE WITH REINFORCED ADHESION FORCE

(75) Inventors: Nam Kyun Park, Seoul (KR); Hae Chan Park, Chungcheongbuk-do (KR); Cheol Seong Hwang, Seoul (KR); Byung Joon Choi, Seoul (KR)

(73) Assignees: Hynix Semiconductor Inc., Kyoungki-do (KR); Seoul National University R&DB Foundation, Seoul (KR)

( * ) Notice: Subject to any disclaimer, the term of this patent is extended or adjusted under 35 U.S.C. 154(b) by 15 days.

(21) Appl. No.: 12/104,873

(22) Filed: Apr. 17, 2008

(65) Prior Publication Data
US 2009/0020741 A1 Jan. 22, 2009

(30) Foreign Application Priority Data
Jul. 20, 2007 (KR) .................... 10-2007-0072742

(51) Int. Cl.
*H01L 29/04* (2006.01)
(52) U.S. Cl. .............. 257/3; 257/4; 257/5; 257/E29.17; 257/E27.004; 365/148
(58) Field of Classification Search ........................ None
See application file for complete search history.

(56) References Cited
U.S. PATENT DOCUMENTS
2006/0266992 A1* 11/2006 Matsui et al. .................. 257/4

2007/0102691 A1 5/2007 Campbell et al.

FOREIGN PATENT DOCUMENTS

| JP | 2006-352082 | 12/2006 |
|---|---|---|
| KR | 100718156 B1 | 5/2007 |
| WO | 2005/112118 | 11/2005 |

* cited by examiner

*Primary Examiner*—Evan Pert
*Assistant Examiner*—Scott R Wilson
(74) *Attorney, Agent, or Firm*—Ladas & Parry LLP

(57) ABSTRACT

A phase change memory device includes a semiconductor substrate having a plurality of phase change cell regions. A bottom electrode is formed in each phase change cell region of the semiconductor substrate. An insulation layer is formed on the semiconductor substrate to cover the bottom electrode, and the insulation layer includes a contact hole exposing the bottom electrode. A contact plug is formed within the contact hole. A stacked pattern comprising a phase change layer and a top electrode is formed over the insulation layer. In the phase change memory device a buffer layer is interposed between the insulation layer and the phase change layer to reinforce the adhesion force between them. The buffer layer prevents the phase change material from peeling off due to an inconstant adhesion force between the phase change material and the insulation layer.

16 Claims, 9 Drawing Sheets

PHASE CHANGE MEMORY DEVICE WITH REINFORCED ADHESION FORCE

CROSS-REFERENCE TO RELATED APPLICATIONS

The present application claims priority to Korean patent application number 10-2007-0072742 filed on Jul. 20, 2007, which is incorporated herein by reference in its entirety.

BACKGROUND OF THE INVENTION

The present invention relates to a phase change memory device, and more particularly, to a phase change memory device in which a phase change layer can be formed in a stable manner.

Memory devices are typically divided into two categories: volatile random access memory (RAM), which loses inputted information when power is interrupted; and non-volatile read-only memory (ROM), which continuously maintains the stored state of inputted information even when power is interrupted. Examples of volatile RAM include dynamic RAM (DRAM) and static RAM (SRAM), and examples of non-volatile ROM include flash memory devices such as electrically erasable and programmable ROM (EEPROM) can be mentioned.

Although DRAM is an excellent memory device, DRAM must have a high charge storing capacity, and therefore the surface area of an electrode of the DRAM must be increased. When the surface area of the electrode is increased, high levels of integration become difficult. Further, in flash memory devices two gates are stacked upon one another. Accordingly, a high operation voltage is required. Therefore, the power source voltage becomes insufficient, and a separate booster circuit is necessary to supply the required voltage for write and delete operations. This also makes it difficult to accomplish high levels of integration.

In order to rectify these problems, attempts have been made to develop a memory device having a simple configuration that is capable of accomplishing a high level of integration while retaining the characteristics of a non-volatile memory device. As a result, phase change memory devices are currently being studied.

FIG. 1 is a cross-sectional view showing a conventional phase change memory device.

In FIG. 1, a bottom electrode 110 is formed on a semiconductor substrate 100 having a switching element (not shown). An insulation layer 120 is formed over the semiconductor substrate 100 to cover the bottom electrode 110. A contact plug 130 is formed in the insulation layer 120 to contact the bottom electrode 110. A stacked pattern consisting of a phase change layer 150 and a top electrode 160 is formed on the contact plug 130 and the insulation layer 120 contacts the contact plug 130.

In a phase change memory device, a phase change occurs in the phase change layer 150 (which is interposed between the bottom and top electrodes 110 and 160) from a crystalline state to an amorphous state due to a current flow between the bottom electrode 110 and the top electrode 160. There resistance of the crystalline state is different from that of the amorphous state, and information stored in a cell is recognized based on this difference.

The phase change memory device has a simple configuration and can be highly integrated since there is no interference between adjoining cells. The phase change memory device can operate at high speeds, since the phase change memory device has a rapid read speed (several tens of ns) and a relatively rapid write speed (several tens to several hundreds of ns). Also, the phase change memory device has excellent compatibility with existing CMOS logic processes; and therefore, manufacturing cost can be saved. Accordingly, phase change memory devices are looked upon as a memory device with a high degree commercial potential.

However, in the conventional phase change memory device described above, the phase change layer formed on the insulation layer is formed as an unstable thin film. Therefore, a problem exists, in that there is a high probability that the phase change layer will peel off of the bottom electrode during a subsequent patterning process.

In more detail, in a typical phase change memory device, a chalcogenide layer as a compound composed of germanium (Ge), antimony (Sb) and tellurium (Te) is used as the phase change material. The adhesion of the chalcogenide layer and the insulating material is unstable, and therefore the chalcogenide layer cannot be uniformly formed as a thin film on the insulating material. As a consequence, the chalcogenide layer peels off of the bottom electrode during a subsequent patterning process.

FIG. 2 includes photographs showing thin film characteristics of a chalcogenide layer formed as a phase change layer on a metallic material and an insulating material.

When viewing FIG. 2, one can see that when the chalcogenide layer is formed on a TiN or W metal layer, the chalcogenide layer is formed as a thin film having dense grains. On the other hand, one can see that when the chalcogenide layer is formed on an $SiO_2$ or an $Si_3N_4$ insulating layer, the chalcogenide layer cannot be formed as a thin film having dense grains due to the growth of non-uniform grains.

As a consequence, in the conventional phase change memory device, the phase change layer can peel off of the bottom electrode due to a poor adhesion force between the insulating material and the phase change layer, and therefore the phase change layer cannot be formed in a stable manner. Accordingly, it is difficult to ensure the characteristics and reliability of the conventional phase change memory device.

SUMMARY OF THE INVENTION

The present invention provides a phase change memory device in which the adhesion force between the phase change layer and the insulating material is increased.

Additionally, the present invention provides a phase change memory device that secures a stable adhesion force between the phase change layer and the insulating material, thereby improving the characteristics and the reliability of the phase change memory device.

In one aspect, a phase change memory device comprises a buffer layer interposed between an insulation layer and a phase change layer to reinforce the adhesion force between them.

The insulation layer comprises any one of an undoped silica glass (USG) layer, a phosphosilicate glass (PSG) layer, a borophosphosilicate glass (BPSG) layer, a spin on glass (SOG) layer, a tetraethyl orthosilicate (TEOS) layer, and a high density passivation (HDP) layer.

The buffer layer comprises any one of a $TiO_2$ layer, an $La_2O_3$ layer, an $HfO_2$ layer, a $Ta_2O_5$ layer, a $ZrO_2$ layer, and a $Y_2O_3$ layer.

The buffer layer has a thickness in the range of 5~30 Å.

The phase change layer is formed in the sequence Ge—Sb—Te or In—Sb—Te—Ag.

In another aspect, a phase change memory device comprises a semiconductor substrate having a plurality of phase change cell regions; a bottom electrode formed in each phase change cell region of the semiconductor substrate; an insulation layer formed on the semiconductor substrate to cover the bottom electrode, with the insulation layer having a contact hole exposing the bottom electrode; a contact plug formed in the contact hole; a buffer layer formed on the insulation layer including the contact plug; and a stacked pattern comprising a phase change layer and a top electrode formed on the buffer layer.

The insulation layer comprises any one of a USG layer, a PSG layer, a BPSG layer, an SOG layer, a TEOS layer, and an HDP layer.

The buffer layer comprises any one of a $TiO_2$ layer, an $La_2O_3$ layer, an $HfO_2$ layer, a $Ta_2O_5$ layer, a $ZrO_2$ layer, and a $Y_2O_3$ layer.

The buffer layer has a thickness in the range of 5~30 Å.

The phase change layer is formed in the sequence Ge—Sb—Te or In—Sb—Te—Ag.

In yet another aspect, a phase change memory device comprises a semiconductor substrate having a plurality of phase change cell regions; a bottom electrode formed in each phase change cell region of the semiconductor substrate; an insulation layer formed on the semiconductor substrate to cover the bottom electrode, with the insulation layer having a contact hole exposing the bottom electrode; a buffer layer formed on a surface of the contact hole; a phase change layer formed in the contact hole having the buffer layer formed therein; and a top electrode formed on the phase change layer.

The insulation layer comprises any one of a USG layer, a PSG layer, a BPSG layer, an SOG layer, a TEOS layer, and an HDP layer.

The buffer layer comprises any one of a $TiO_2$ layer, an $La_2O_3$ layer, an $HfO_2$ layer, a $Ta_2O_5$ layer, a $ZrO_2$ layer, and a $Y_2O_3$ layer.

The buffer layer has a thickness in the range of 5~30 Å.

The phase change layer is formed in the sequence Ge—Sb—Te or In—Sb—Te—Ag.

DESCRIPTION OF SPECIFIC EMBODIMENTS

Hereafter, the specific embodiments of the present invention will be described in detail with reference to the attached drawings.

Figure 1:
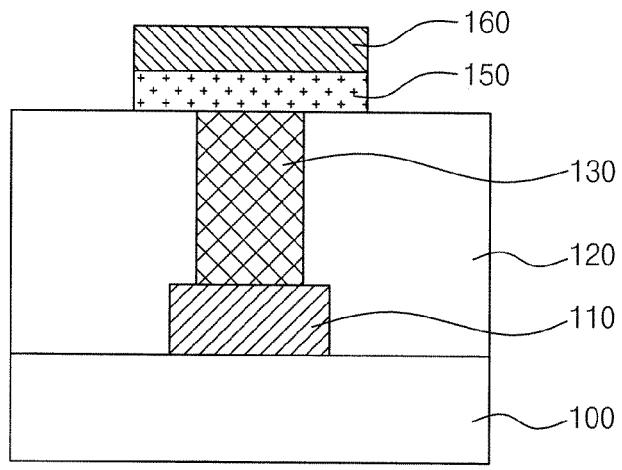
FIG. 1 is a cross-sectional view showing a conventional phase change memory device.
Figure 2:
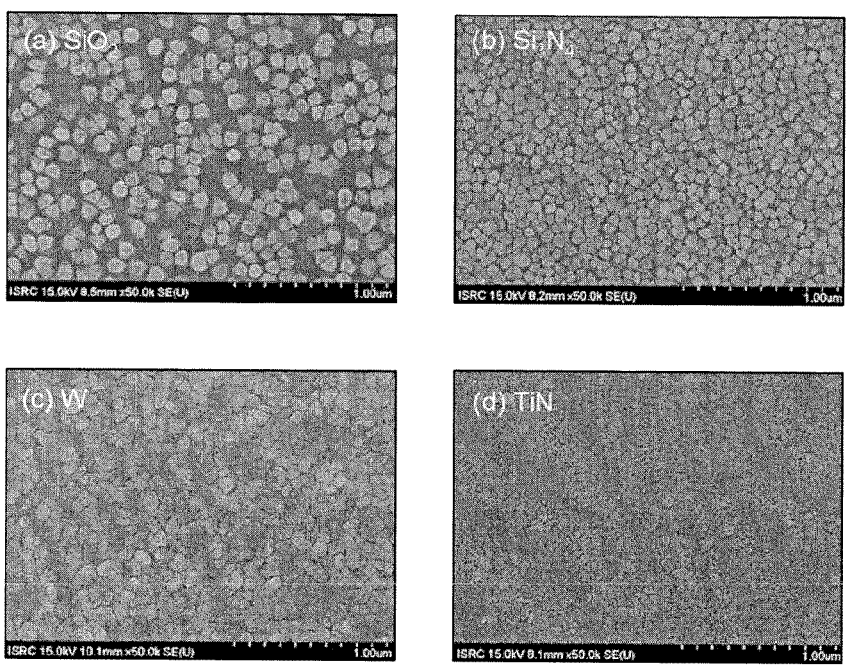
FIG. 2 includes photographs showing the thin film characteristics of a chalcogenide layer formed as a phase change layer on a metallic material and an insulating material.
Figure 3:
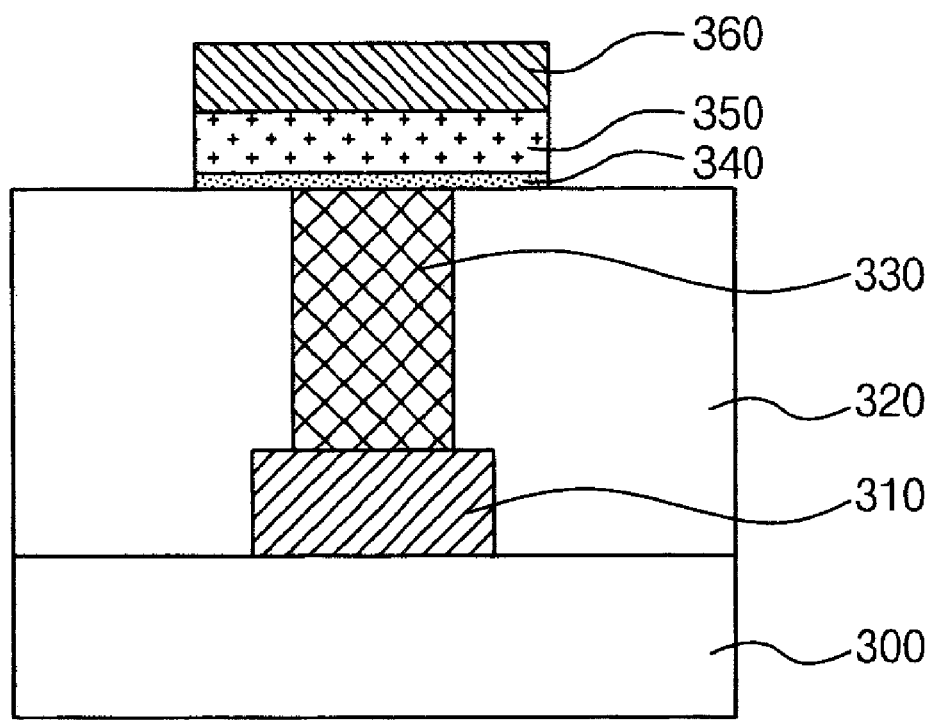
FIG. 3 is a cross-sectional view showing a phase change memory device in accordance with an embodiment of the present invention.

FIG. 3 is a cross-sectional view showing a phase change memory device in accordance with an embodiment of the present invention.

Referring to FIG. 3, a phase change memory device in accordance with an embodiment of the present invention includes a buffer layer 340 interposed between an insulation layer 320 and a phase change layer 350. The buffer layer 340 reinforces the adhesion force between the insulation layer 320 and the buffer layer 340. The buffer layer 340 may comprise, for example, any one of a $TiO_2$ layer, an $La_2O_3$ layer, an $HfO_2$ layer, a $Ta_2O_5$ layer, a $ZrO_2$ layer, and a $Y_2O_3$ layer. The thickness of the buffer layer 340 is relatively small, and preferably, the thickness of the buffer layer 340 is in the range of 5~30 Å so that current can flow to the phase change layer 350 when the phase transition of the phase change layer 350 occurs.

In the phase change memory device, the buffer layer 340 is itself an insulating material; and therefore, the buffer layer 340 adheres well to the insulation layer 320 positioned thereunder, and the buffer layer has excellent adhesion force with the phase change material.

Accordingly, when the phase change memory device is formed with the buffer layer interposed between the bottom electrode 310 and the phase change layer 350, the phase change layer can be formed as a uniform and dense layer. As a result, it is possible to prevent the phase change layer from peeling off during subsequent processes. Accordingly, in the present invention, the phase change layer can be formed in a stable manner, and therefore a stable phase transition characteristic is obtained in the phase change layer, and the characteristics and reliability of the phase change memory device are improved.

In FIG. 3, reference numeral 300 designates a semiconductor substrate, 310 a bottom electrode, 330 a contact plug, and 360 a top electrode.

FIGS. 4A through 4E are cross-sectional views shown the steps in a method for manufacturing a phase change memory device in accordance with an embodiment of the present invention.

Figure 4A:
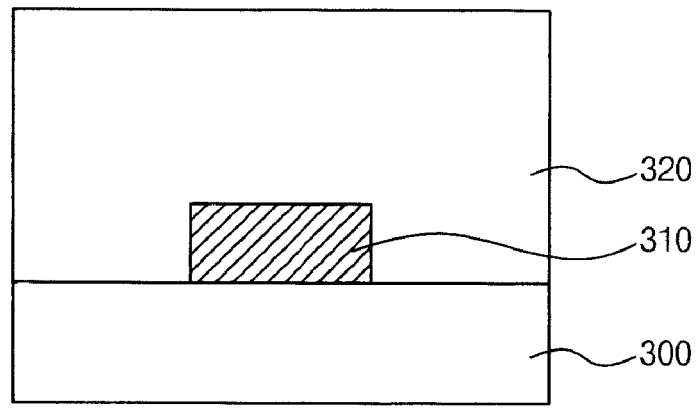
FIGS. 4A through 4E are cross-sectional views shown for illustrating the steps in a method for manufacturing a phase change memory device in accordance with an embodiment of the present invention.

Referring to FIG. 4A, a bottom electrode 310 is formed in each phase change cell region of a semiconductor substrate 300 having a plurality of phase change cell regions. The semiconductor substrate 300 is formed with switching elements (not shown) in the respective phase change cell regions. The bottom electrode 310 comprises any one of a metal, an alloy, a metal nitride, a metal oxide and nitride, and a conductive carbon compound. Preferably, the bottom electrode 310 comprises any one of W, TiN, TaN, WN, MoN, NbN, TiSiN, TiAlN, TiBN, ZrSiN, WSiN, WBN, ZrAlN, MoSiN, MoAlN, Ti, Mo, Ta, TaSi, TiW, TiON, TiAlON, WON, and TaON. An insulation layer 320 is formed on the semiconductor substrate 300 to cover the bottom electrode 310. The insulation layer 320 is comprises any one of an undoped silica glass (USG) layer, a phosphosilicate glass (PSG) layer, a borophosphosilicate glass (BPSG) layer, a spin on glass (SOG) layer, a tetraethyl orthosilicate (TEOS) layer, and a high density passivation (HDP) layer.

Figure 4B:
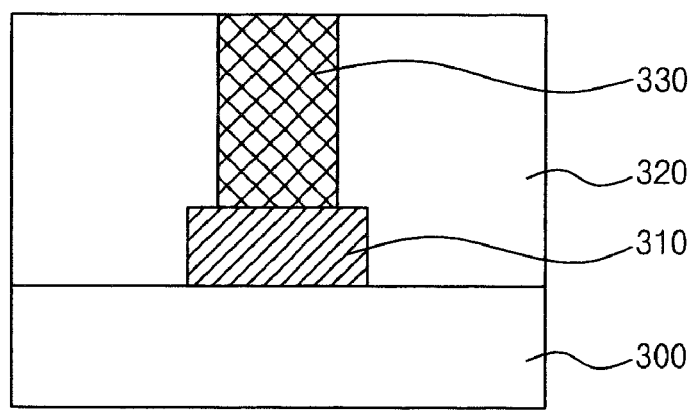

Referring to FIG. 4B, the insulation layer 320 is etched to define a contact hole exposing the bottom electrode 310. A metallic material is deposited on the insulation layer 320 to fill the contact hole, and the metallic material is CMPed (chemically and mechanically polished) to form a contact plug 330, which comes into contact with the bottom electrode 310, in the contact hole. The contact plug 330 comprises any one of a metal, an alloy, a metal nitride, a metal oxide and nitride, and a conductive carbon compound. Preferably, the contact plug 330 comprises any one of W, TiN, TaN, WN, MoN, NbN, TiSiN, TiAlN, TiBN, ZrSiN, WSiN, WBN, ZrAlN, MoSiN, MoAlN, Ti, Mo, Ta, TaSi, TiW, TiON, TiAlON, WON, and TaON.

Figure 4C:
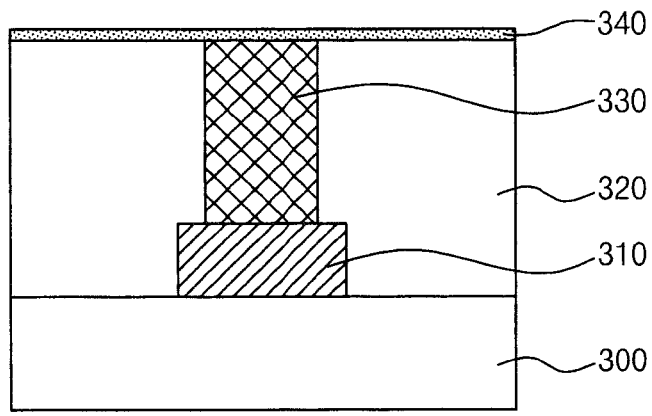

Referring to FIG. 4C, a buffer layer 340 is deposited on the insulation layer 320 and the contact plug 330. The buffer layer 340 comprises any one of a $TiO_2$ layer, an $La_2O_3$ layer, an $HfO_2$ layer, a $Ta_2O_5$ layer, a $ZrO_2$ layer, and a $Y_2O_3$ layer. The thickness of the buffer layer 340 is formed to be relatively small; and preferably, the thickness is in the range of 5~30 Å so that current can flow to the phase change layer when the phase transition of the phase change layer occurs.

Figure 4D:
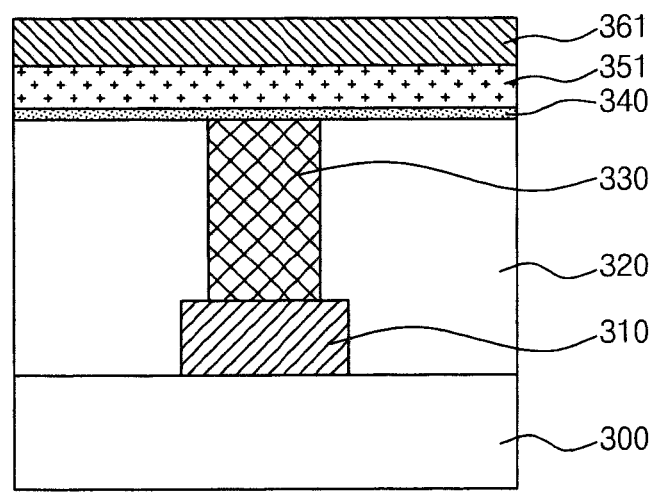

Referring to FIG. 4D, a phase change material 351 and a conductive layer 361 for a top electrode are sequentially deposited on the buffer layer 340. The phase change material 351 is formed in the sequence Ge—Sb—Te or In—Sb—Te—Ag. Here, the phase change material 351 has excellent adhesion force with the buffer layer 340, and thus the phase change material 351 is formed on the buffer layer 340 as a thin film composed of dense grains.

Figure 4E:
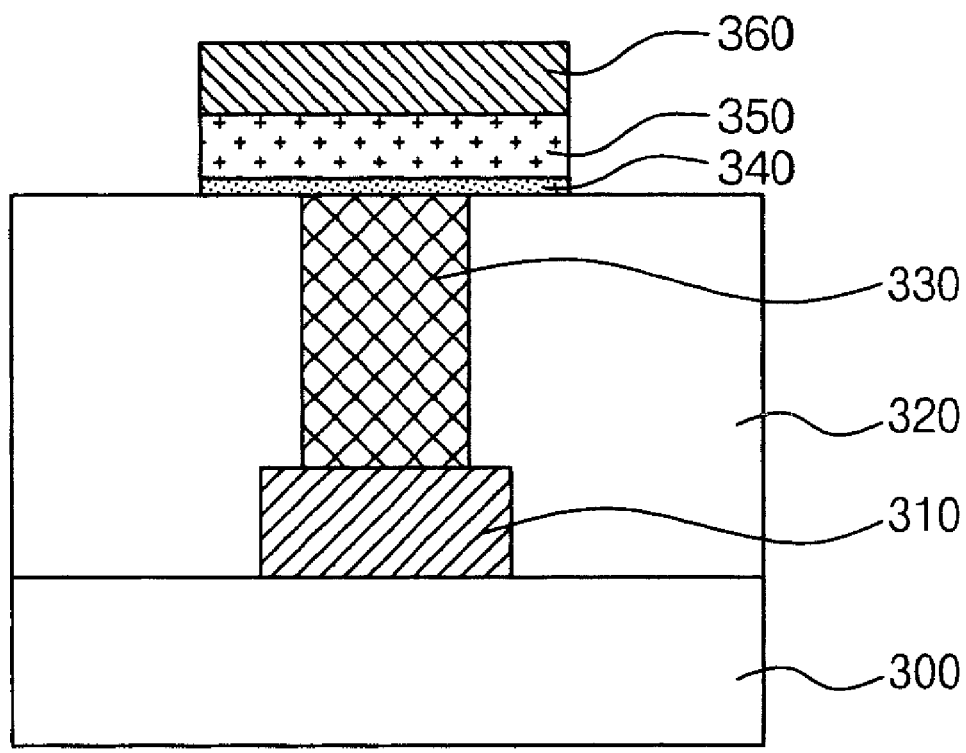

Referring to FIG. 4E, the conductive layer 361 and the phase change material 351 are etched to form a stacked pattern comprising a phase change layer 350 and a top electrode 360. The buffer layer 340 is then etched as shown in FIG. 4D.

Thereafter, a series of well-known subsequent processes are sequentially conducted, and the manufacturing process of the phase change memory device according to an embodiment of the present invention is complete.

As described above, in the phase change memory device according to the present invention, the phase change material 351 adheres well to the buffer layer 340 and is deposited in a stable manner, and therefore it is possible to prevent the phase change layer 350 from peeling off of the bottom electrode 310 (more precisely, the contact plug 330) during a subsequent patterning process.

Figure 5:
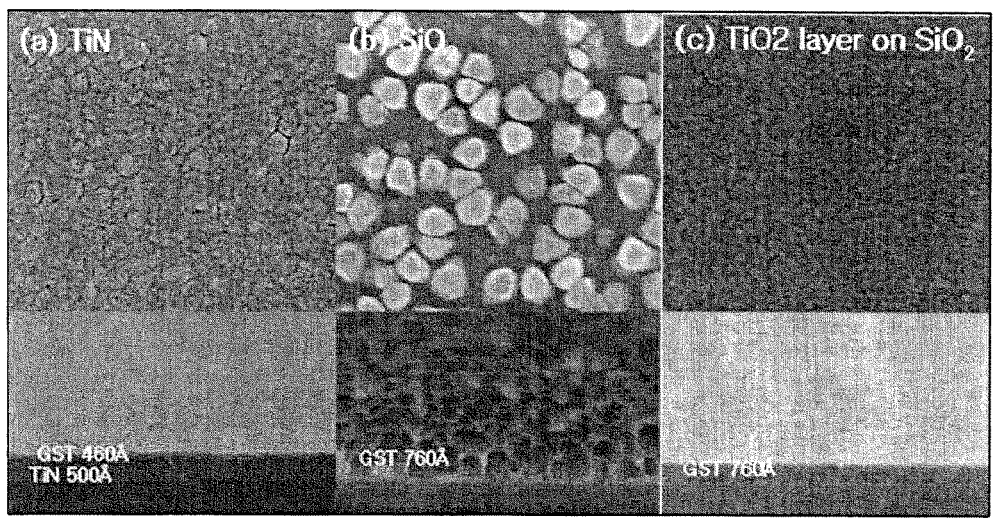
FIG. 5 includes photographs showing morphologies and cross-sectional images of the surface of a phase change material formed on lower layers of various materials.

FIG. 5 includes photographs showing morphologies and cross-sectional images of the surface of a phase change material formed on lower layers of various materials.

As one can see when referring to FIG. 5, when the phase change material was deposited on a TiN metallic material, the phase change material was deposited as a relatively dense thin film. However, it can be observed from FIG. 5, that when the phase change material was deposited on the TiN metallic material cracks occurred in the surface of the phase change material. When the phase change material was deposited on an $SiO_2$ insulating material, one can see that the surface of the phase change material had very coarse non-uniform grains.

On the other hand, when the phase change material was deposited on a $TiO_2$ insulating material according to the present invention, one can see that the phase change material was deposited as a very dense thin film without cracks occurring in the surface of the phase change material (unlike the case in which the phase change material was deposited on TiN).

Accordingly, in the present invention, the phase change material is formed on a $TiO_2$ buffer layer (which is formed on an insulation layer) rather than forming the phase change material on the insulation layer. Therefore, the phase change material can be deposited in a stable manner in the present invention.

Figure 6A:
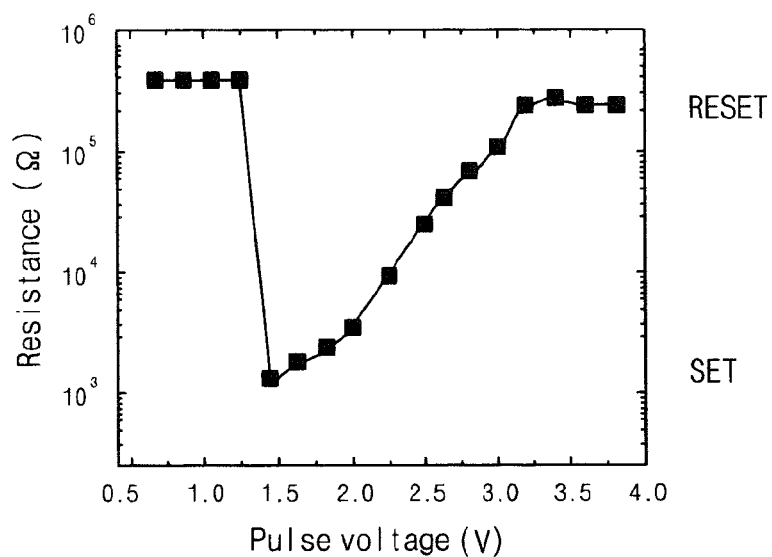
FIG. 6A is a graph illustrating the phase transition characteristic of the phase change memory device in accordance with an embodiment of the present invention.

FIG. 6A is a graph illustrating the phase transition characteristic of a phase change memory device in which a buffer layer is interposed between the insulation layer and the phase change layer.

Referring to FIG. 6A, assuming that the initial state of the phase change memory device is a RESET state, one can see that as an applied voltage increases, the stable phase transition characteristic of the phase change layer when changing from the RESET state to a SET state and then from the SET state to a RESET state is obtained. That is, a phase transition in the phase change layer occurs in a stable manner when a buffer layer made of an insulating material is formed between an insulation layer and the phase change layer.

Figure 6B:
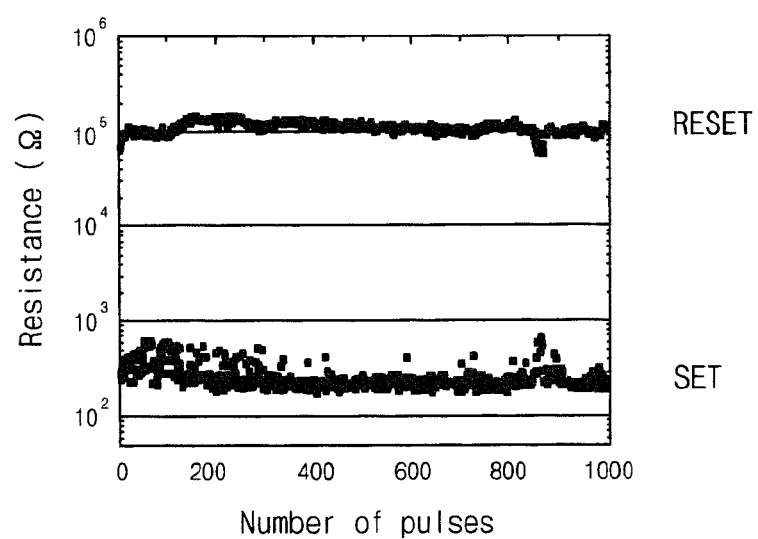
FIG. 6B is a graph illustrating the switching test result of the phase change memory device in accordance with the embodiment of the present invention.

FIG. 6B is a graph illustrating the result of a switching reliability test result of a phase change memory device in which a buffer layer is interposed between the insulation layer and the phase change layer.

Referring to FIG. 6B, one can see that the resistance of a RESET state is over 100 times the resistance of a SET state, and a phase transition occurs in a stable manner in the phase change layer in over 1,000 switching operations.

As described above, in the phase change memory device according to the present invention, a buffer layer is interposed between the insulation layer and the phase change layer, making it possible to prevent the phase change material from peeling off due to an inconstant adhesion force between the phase change material and the insulation layer. Also, in the phase change memory device according to the present invention, a stable phase transition characteristic is obtained even with the buffer layer interposed between the bottom electrode and the phase change layer. Accordingly, in the phase change memory device according to the present invention, the stable formation of the phase change layer provides a phase change memory device with improved characteristics and reliability while retaining a stable phase transition characteristic.

Figure 7A:
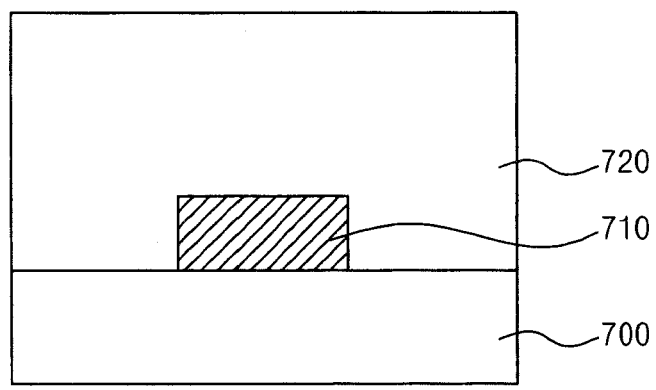
FIGS. 7A through 7C are cross-sectional views showing the steps in a method for manufacturing a phase change memory device in accordance with an embodiment of the present invention.
Figure 7B:
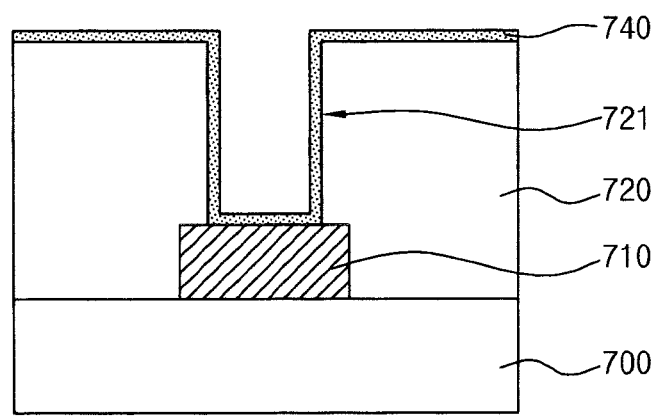
Figure 7C:
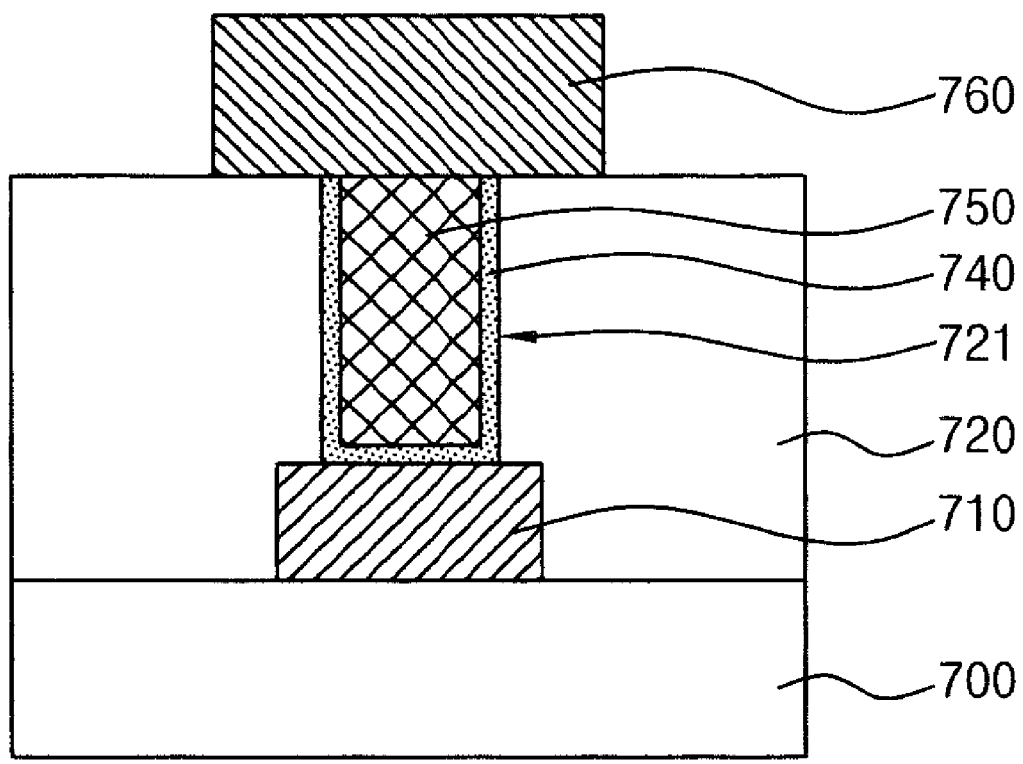

FIGS. 7A through 7C are cross-sectional views showing the steps in a method for manufacturing a phase change memory device in accordance with another embodiment of the present invention.

Referring to FIG. 7A, a bottom electrode 710 is formed in each phase change cell region of a semiconductor substrate 700 having a plurality of phase change cell regions. The semiconductor substrate 700 is formed with switching elements (not shown) in the respective phase change cell regions. The bottom electrode 710 comprises any one of a metal, an alloy, a metal nitride, a metal oxide and nitride, and a conductive carbon compound. Preferably, the bottom electrode 710 comprises any one of W, TiN, TaN, WN, MoN, NbN, TiSiN, TiAlN, TiBN, ZrSiN, WSiN, WBN, ZrAlN, MoSiN, MoAlN, Ti, Mo, Ta, TaSi, TiW, TiON, TiAlON, WON, and TaON. An insulation layer 720 is formed on the semiconductor substrate 700 to cover the bottom electrode 710. The insulation layer 720 is formed as any one of a USG layer, a PSG layer, a BPSG layer, an SOG layer, a TEOS layer, and an HDP layer.

Referring to FIG. 7B, the insulation layer 720 is etched to define a contact hole 721 exposing the bottom electrode 710. A buffer layer 740 is deposited on the insulation layer 720 including the surface of the contact hole 721. The buffer layer 740 is formed as any one of a $TiO_2$ layer, an $La_2O_3$ layer, an $HfO_2$ layer, a $Ta_2O_5$ layer, a $ZrO_2$ layer, and a $Y_2O_3$ layer. The thickness of the buffer layer 740 is formed to be relatively small; and preferably, the thickness is in the range of 5~30 Å so that current can flow to the phase change layer when the phase transition of the phase change layer occurs.

Referring to FIG. 7C, a phase change material is deposited on the buffer layer 740 to fill the contact hole 721. The phase change material is formed in the sequence Ge—Sb—Te or In—Sb—Te—Ag. As described above, the phase change material has excellent adhesion force with the buffer layer 740, and thus the phase change material can be deposited in a stable manner. The phase change material and the buffer layer 740 are CMPed, and a phase change layer 750 is formed in the contact hole 721 on the surface of the buffer layer 740. A conductive layer for a top electrode is formed on the phase change layer 750, the buffer layer 740, and the insulation layer 720. The conductive layer is then patterned to form a top electrode 760.

Thereafter, a series of well-known subsequent processes are sequentially conducted, and the manufacturing process of the phase change memory device according to an embodiment of present invention is complete.

In the phase change memory device according to the present embodiment, the buffer layer interposed between the insulation layer and the phase change layer makes it possible to prevent the phase change layer form peeling off due to an inconstant adhesion force between the phase change layer and the insulation layer. Hence, the present invention ensures the stable formation of the phase change layer; and therefore a stable phase transition characteristic of the phase change layer is obtained along with an improvement in the characteristics and the reliability of the phase change memory device.

Although specific embodiments of the present invention have been described for illustrative purposes, those skilled in the art will appreciate that various modifications, additions, and substitutions are possible without departing from the scope and spirit of the invention as disclosed in the accompanying claims.

What is claimed is:

1. A phase change memory device comprising:
   an insulation layer;
   a phase change layer formed over the insulation layer;
   a buffer layer formed between the insulation layer and the phase change layer to reinforce adhesion force between the insulation layer and the phase change layer;
   wherein the buffer layer comprises any one of an $La_2O_3$ layer and a $Y_2O_3$ layer.

2. The phase change memory device of claim 1, wherein the insulation layer comprises any one of an undoped silica glass (USG) layer, a phosphosilicate glass (PSG) layer, a borophosphosilicate glass (BPSG) layer, a spin on glass (SOG) layer, a tetraethyl orthosilicate (TEOS) layer, and a high density passivation (HDP) layer.

3. The phase change memory device of claim 1 wherein the buffer layer has a thickness in the range of 5~30 Å.

4. The phase change memory device of claim 1, wherein the phase change layer is formed in the sequence Ge—Sb—Te or In—Sb—Te—Ag.

5. A phase change memory device including a semiconductor substrate having a plurality of phase change cell regions, the phase change memory device comprising:
   a bottom electrode formed in each phase change cell region of the semiconductor substrate;
   an insulation layer formed on the semiconductor substrate to cover the bottom electrode, the insulation layer having a contact hole exposing the bottom electrode;
   a contact plug formed in the contact hole;
   a buffer layer formed on the insulation layer, wherein the buffer layer comprises an one of an $La_2O_3$ layer and a $Y_2O_3$ layer; and
   a stacked pattern comprising a phase change layer and a top electrode formed on the buffer layer.

6. The phase change memory device of claim 5, wherein the insulation layer comprises any one of a USG layer, a PSG layer, a BPSG layer, an SOG layer, a TEOS layer, and an HDP layer.

7. The phase change memory device of claim 5, wherein the buffer layer has a thickness in the range of 5~30 Å.

8. The phase change memory device of claim 5, wherein the phase change layer is formed in the sequence Ge—Sb—Te or In—Sb—Te—Ag.

9. The phase change memory device of claim 5, wherein the width of the buffer layer, the phase change layer, and the top electrode covers the contact plug and extends over the insulation layer, and the buffer layer, phase change layer, and the top electrode have substantially the same width.

10. A phase change memory device including a semiconductor substrate having a plurality of phase change cell regions, the phase change memory device comprising:
    a bottom electrode formed in each phase change cell region of the semiconductor substrate;
    an insulation layer formed on the semiconductor substrate to cover the bottom electrode, the insulation layer having a contact hole exposing the bottom electrode;
    a buffer layer formed on a surface of the insulation layer within the contact hole;
    a phase change layer formed on the buffer layer to fill the contact hole; and
    a top electrode formed on the phase change layer.

11. The phase change memory device of claim 10, wherein the insulation layer comprises any one of a USG layer, a PSG Layer, a BPSG layer, an SOG layer, a TEOS layer, and an HDP layer.

12. The phase change memory device of claim 10, wherein the buffer layer comprises any one of a $TiO_2$ layer, an $La_2O_3$ layer, an $HfO_2$ layer, a $Ta_2O_5$ layer, a $ZrO_2$ layer, and a $Y_2O_3$ layer.

13. The phase change memory device of claim 10, wherein the buffer layer has a thickness in the range of 5~30 Å.

14. The phase change memory device of claim 10, wherein the phase change layer is formed in the sequence Ge—Sb—Te or In—Sb—Te—Ag.

15. The phase change memory of claim 10, wherein the top electrode covers the phase change layer and a portion of the insulation layer.

16. The phase change memory at claim 10, wherein the buffer layer is interposed between a side surface of the insulation layer within the contact hole and a side surface of the phase change layer filling the contact hole.

* * * * *